(12) United States Patent
Zeller

(10) Patent No.: US 10,254,373 B2
(45) Date of Patent: Apr. 9, 2019

(54) METHOD AND APPARATUS FOR ACQUIRING MAGNETIC RESONANCE DATA WITH NAVIGATOR SCANS ON OPPOSITE SIDES OF THE EXAMINATION REGION

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 143 days.

(21) Appl. No.: 15/409,992

(22) Filed: Jan. 19, 2017

(65) Prior Publication Data
US 2017/0205487 A1 Jul. 20, 2017

(30) Foreign Application Priority Data

Jan. 19, 2016 (DE) .................. 10 2016 200 629

(51) Int. Cl.
*G01R 33/567* (2006.01)
(52) U.S. Cl.
CPC ....... *G01R 33/5676* (2013.01); *G01R 33/567* (2013.01)
(58) Field of Classification Search
CPC .......................... G01R 33/5676; G01R 33/567
USPC ....................................................... 324/309
See application file for complete search history.

(56) References Cited

U.S. PATENT DOCUMENTS

| | | | | |
|---|---|---|---|---|
| 7,388,973 B2 * | 6/2008 | Fidrich | ..................... | G06T 7/12 378/21 |
| 8,183,865 B2 * | 5/2012 | Stemmer | .......... | G01R 33/56509 324/306 |
| 9,671,480 B2 * | 6/2017 | Morinaga | .......... | G01R 33/4835 |
| 2002/0191822 A1 * | 12/2002 | Pieper | ................... | G06F 19/321 382/128 |
| 2011/0234222 A1 * | 9/2011 | Frahm | ................ | G01R 33/5611 324/309 |
| 2012/0313640 A1 * | 12/2012 | Pfeuffer | ............. | G01R 33/4824 324/309 |
| 2013/0187649 A1 | 7/2013 | Bhat et al. | | |

(Continued)

FOREIGN PATENT DOCUMENTS

JP 2003190113 A 7/2003

OTHER PUBLICATIONS

Miller et al "Nonlinear Phase Correction for Navigated Diffusion Imaging"; Magnetic Resonance in Medicine vol. 50; pp. 343-353; (2003).

(Continued)

*Primary Examiner* — Susan S Lee
(74) *Attorney, Agent, or Firm* — Schiff Hardin LLP

(57) ABSTRACT

In a method and apparatus for magnetic resonance imaging, a first diagnostic imaging scan is executed that includes a recording of first set of magnetic resonance scan data from a first subregion of an examination region, and a second diagnostic imaging scan is executed that includes a recording of a second set of magnetic resonance scan data from a second subregion of the examination region. A navigator scan is executed chronologically between the first diagnostic imaging scan and second diagnostic imaging scan, wherein the navigator scan includes a recording of at least two navigator slices arranged on opposite sides of the examination region.

13 Claims, 3 Drawing Sheets

(56) References Cited

U.S. PATENT DOCUMENTS

| | | |
|---|---|---|
| 2013/0229177 A1 | 9/2013 | Bammer et al. |
| 2015/0084629 A1 | 3/2015 | Porter |
| 2016/0252596 A1 | 9/2016 | Nielsen et al. |
| 2016/0313433 A1 | 10/2016 | Beck |

OTHER PUBLICATIONS

Raj et.al.: "Respiratory effects in human functional magnetic resonance imaging due to bulk susceptibility changes", Phys. Med. Biol., vol. 46, pp. 3331-3340 (2001).

Setsompop et al., "Improving diffusion MRI using simultaneous multi-slice echo planar imaging," NeuroImage vol. 63 569-580; (2012).

Biancardi et al. "Effects of chest motion and respiratory pressure wave in the brain investigated using high spatial resolution IMRI at 7 Tesla,"Proc. Intl. Soc. Mag. Reson. Med. 21, p. 3348, (2013).

Pfeuffer et al: "Dynamic Phase Echo-Planar Imaging—Detection and Correction of Dynamic Off-Resonance", ISMRM (2011) abstract (2011).

Raj et al., "A model for susceptibility artefacts from respiration in functional echo-planar magnetic resonance imaging," Phys. Med. Bio. 45 3809-3820. (2000).

Feinberg et al: "Simultaneous Echo Refocusing in EPI"; Magnetic Resonance Medicine vol. 48, pp. 1-5; (2002).

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

Zeller et. al.; "Respiration Impacts Phase Difference-Based Field Maps in Echo Planar Imaging"; Magnetic Resonance in Medicine vol. 72; pp. 446-451; (2014).

Pfeuffer et al.., "Correction of Physiologically Induced Global Off-Resonance Effects in Dynamic Echo-Planar and Spiral Functional Imaging", Magnetic Resonance in Medicine vol. 47; 344-353; (2002).

\* cited by examiner

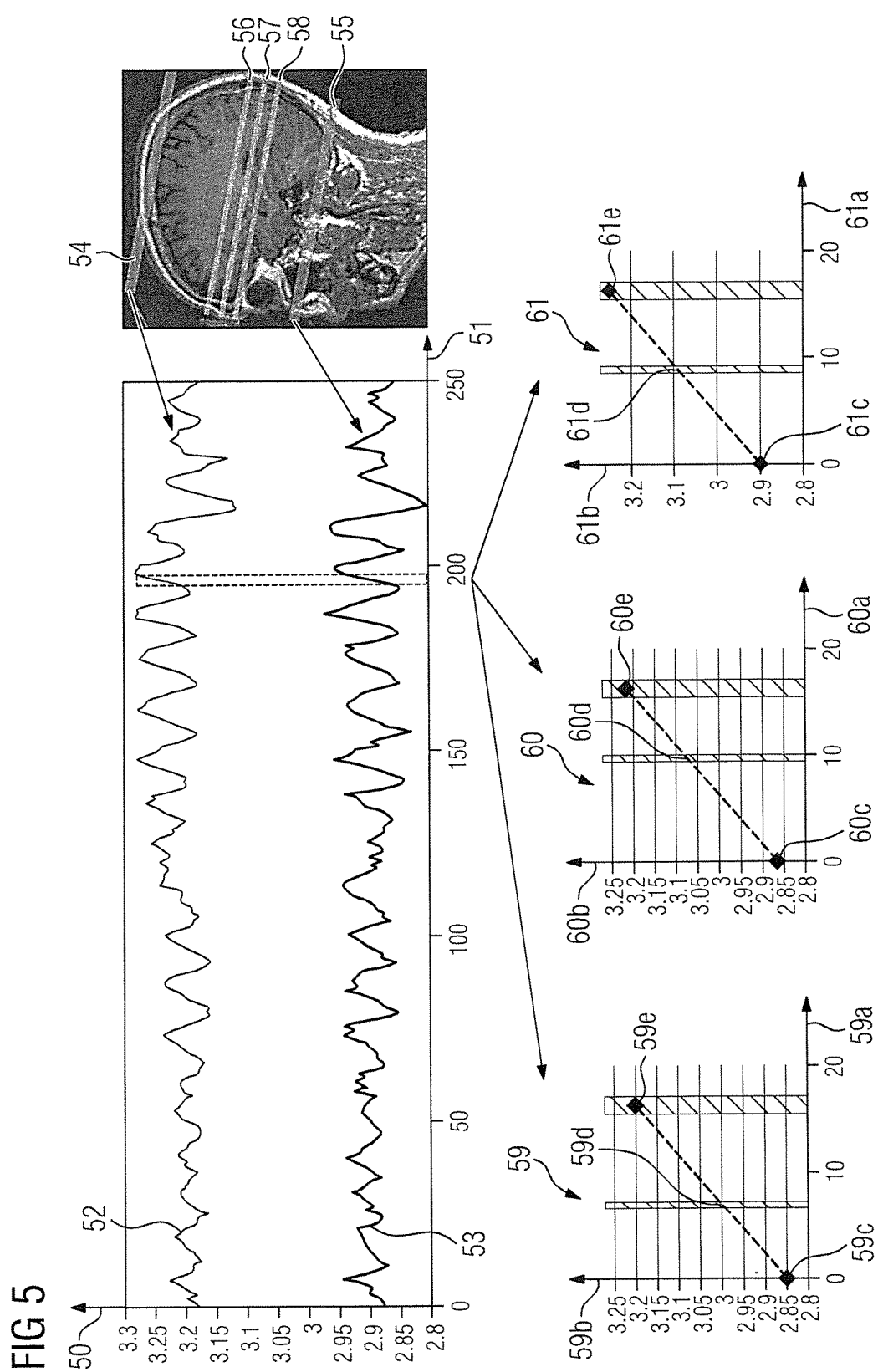

METHOD AND APPARATUS FOR ACQUIRING MAGNETIC RESONANCE DATA WITH NAVIGATOR SCANS ON OPPOSITE SIDES OF THE EXAMINATION REGION

BACKGROUND OF THE INVENTION

Field of the Invention

The invention relates to a method for magnetic resonance imaging, and a magnetic resonance apparatus and a non-transitory data storage medium for implementing such a method Description of the Prior Art In a magnetic resonance device, also called a magnetic resonance tomography system, the body to be examined of an object to be examined, for example a patient, a healthy training volunteer or a phantom, is exposed to a relatively high basic magnetic field with the use of a basic field magnet, for example 1.5 or 3 or 7 tesla. In addition, gradient pulses are activated with the use of a gradient coil arrangement. A radio-frequency antenna arrangement emits radio-frequency pulses, for example excitation pulses, from suitable antennas that cause the nuclear spins of specific atoms excited to resonance by these radio-frequency pulses to be tilted by a defined flip angle relative to the magnetic field lines of the basic magnetic field. Upon relaxation of the nuclear spins, radio-frequency signals, known as magnetic resonance signals, are emitted, received by suitable radio-frequency antennas and then processed further. Finally, the desired image data can be reconstructed from the raw data acquired in this manner.

Therefore, for a specific scan, a specific magnetic resonance sequence, also referred to as a pulse sequence, is to be emitted, this sequence being composed of a series of radio-frequency pulses, for example excitation pulses and refocusing pulses and gradient pulses, which are to be emitted with suitable time coordination in different gradient axes along different spatial directions. Chronologically coordinated therewith, readout windows are set, which predetermine the periods of time in which the induced magnetic resonance signals are acquired.

Physiological parameters of the object to be examined, for example respiratory motion or cardiac motion of the object to be examined, can influence magnetic resonance scan data acquired during the magnetic resonance imaging. The physiological parameters of the object to be examined can result in an unwanted change in the magnetic resonance scan data acquired during the magnetic resonance imaging, for example they can influence a signal intensity and/or a phase of the acquired magnetic resonance scan data. This influence can for example occur as a result of motion-induced susceptibility changes. Particularly with echo-planar imaging, the influence of the physiological parameters of the object to be examined can be especially strongly distinct. Also conceivable is the occurrence of motion artifacts in the acquired magnetic resonance image data.

Different methods are known that at least partially compensate of the physiological parameters of the object to be examined during the magnetic resonance imaging. One known possibility for such compensation is the use of navigators during the magnetic resonance imaging. In a navigator scan, the acquisition of the navigators typically includes the activation of radio-frequency pulses and the read-out of navigator slices in addition to the sequence elements used by the magnetic resonance sequence to record the diagnostic magnetic resonance scan data. In this context, the navigator slices are typically only used to compensate the physiological parameters, and can be discarded after the completion of the magnetic resonance sequence.

SUMMARY OF THE INVENTION

An object of the invention is to enable improved magnetic resonance imaging using a navigator scan.

The method for magnetic resonance imaging according to the invention of an object to be examined by operation of a magnetic resonance scanner includes the following method steps:

from a computer, operating a magnetic resonance data acquisition scanner to perform a first diagnostic imaging scan, wherein the first diagnostic imaging scan includes a recording of first set of magnetic resonance scan data (raw data entered in a memory as k-space data) from a first subregion of an examination region, from the computer, operating the magnetic resonance data acquisition scanner to perform a second diagnostic imaging scan, wherein the second diagnostic imaging scan includes a recording of second set of magnetic resonance scan data from a second subregion of the examination region and from the computer, operating the magnetic resonance data acquisition scanner to perform a navigator scan chronologically between the first diagnostic imaging scan and second diagnostic imaging scan, wherein the navigator scan includes a recording of at least two navigator slices situated on opposite sides of the examination region.

The magnetic resonance data from the first and second diagnostic imaging scans, and the navigator data from the navigator scan, are made available from the computer in electronic form, as at least one data file, for further processing as needed.

The examination region, also called the field of view (FOV) represents a volume that is to be depicted in the magnetic resonance image data that are reconstructed from the k-space data. The examination region is typically defined by a user, for example from a localizer scan. The examination region can alternatively or additionally be defined automatically, on the basis of a selected protocol. The first subregion and the second subregion of the examination region are preferably disjoint regions, but may also be spatially overlapping regions. In an embodiment, advantageous application, the first subregion and the second subregion each represent different slices or slice groups of the examination region. It is also conceivable for the first subregion to be identical to the second subregion of the examination region.

In the present case, the magnetic resonance imaging includes the use of a magnetic resonance sequence. The magnetic resonance sequence then includes the first diagnostic imaging scan and the second diagnostic imaging scan. The navigator scan is also part of the magnetic resonance sequence. The first diagnostic imaging scan and second diagnostic imaging scan can represent individual acquisition blocks of a magnetic resonance sequence used for the acquisition of the first set of magnetic resonance scan data and the second set of magnetic resonance scan data. For example, the first diagnostic imaging scan can represent the acquisition of a first slice in echo-planar imaging and the second diagnostic imaging scan the acquisition of a second slice in echo-planar imaging. It is also possible, for example, for the first diagnostic imaging scan to represent a first echo train of turbo-spin-echo imaging and the second diagnostic imaging scan a second echo train of turbo-spin-echo imaging. The first diagnostic imaging scan and the second diagnostic imaging scan can also represent sequence elements other that are considered reasonable to those skilled in the art. The first set of magnetic resonance scan data and the second set of magnetic resonance scan data can be combined after acquisition, for example for the reconstruction of magnetic resonance images.

The second diagnostic imaging scan preferably occurs chronologically immediately following the first diagnostic imaging scan. This means that no further diagnostic imaging scan is performed between the first diagnostic imaging scan and the second diagnostic imaging scan. Hence, the navigator scan can be performed chronologically immediately after the first diagnostic imaging scan, and the second diagnostic imaging scan is performed chronologically immediately after the navigator scan. The fact that the navigator scan is performed chronologically between the first diagnostic imaging scan and the second diagnostic imaging scan means that the navigator scan starts after the first diagnostic imaging scan is completed and that the navigator scan finishes before the second diagnostic imaging scan starts. Alternatively, the start of the navigator scan can chronologically overlap the end of the first diagnostic imaging scan. The end of the navigator scan can also chronologically overlap the start of the second diagnostic imaging scan. The navigator scan can also chronologically overlap the first diagnostic imaging scan and/or the second diagnostic imaging scan completely. For example, the navigator scan can be performed during a dead time that exists at the end of the first diagnostic imaging scan.

While first diagnostic magnetic resonance scan data can be recorded in the first diagnostic imaging scan and second diagnostic magnetic resonance scan data can be recorded in the second diagnostic imaging scan, the at least two navigator slices recorded in the navigator scan can be used only to correct the first set of magnetic resonance scan data and the second set of magnetic resonance scan data and then disposed of (not otherwise stored or used or retained) after the correction. In this context, different navigator techniques for recording the at least two navigator slices in the navigator scan are known to those skilled in the art and thus need not be explained in further detail herein. One advantageous navigator technique is the use of a non-phase-encoded navigator acquired with an echo-planar imaging technique with three echoes. This navigator can be combined in the navigator scan with an echo-planar read-out train in the image scans.

Preferably, the at least two navigator slices are arranged at least partially outside the examination region. To this end, suitable gradient pulses for spatial encoding are used during the recording of the at least two navigator slices. The at least two navigator slices and the examination region are hence preferably spatially disjoint. The at least two navigator slices and the examination region, however, can alternatively partially spatially overlap. In any case, the at least two navigator slices will have at least one spatial portion thereof that is outside the examination region. Furthermore, the at least two navigator slices are themselves are spatially disjoint with respect to each other. In this context, the at least two navigator slices can have a parallel alignment. In specific cases, for example during the monitoring of specific blood vessels, it can also be advisable for the at least two navigator slices to have different alignments with respect to one another.

The at least two navigator slices can be situated completely outside the examination region and on the two opposite sides of the examination region. However, it is also conceivable for the at least two navigator slices to protrude partially into the examination region but still substantially be situated on the two opposite sides of the examination region. In a two-dimensional case, the examination region is typically rectangular and, in a three-dimensional case, it is typically cuboid. The sides of the examination region mean opposing boundary surfaces of the rectangular or cuboid examination region. The opposite sides are usually parallel to each other. In this way, there is an axis that is perpendicular to both opposite sides. The at least two navigator slices can then be arranged along this axis on opposite sides of the examination region. Thus, the at least two navigator slices can be situated, for example, above and below the examination region.

The spatially separated arrangement of the examination region and the at least two navigator slices has the advantage that the recording of the at least two navigator slices has less influence, or no influence at all, on the magnetization of nuclear spins in the examination region. In this way, an unwanted effect of the recording of the at least two navigator slices on the examination region can be advantageously reduced by the site-selective application of the at least two navigator slices. In this way, it is possible to reduce any influence of the recording of the at least two navigator slices on the steady state of the magnetization in the examination region. It is thereby possible for the steady state in the examination region to be retained despite the recording of the at least two navigator slices.

The navigator scan can be performed with the same sequence parameters as the first diagnostic imaging scan or the second diagnostic imaging scan. This can be particularly suitable when the navigator scan at least partially chronologically overlaps the first diagnostic imaging scan and/or the second diagnostic imaging scan. Alternatively, the navigator scan can have different sequence parameters, for example different slice profiles and/or slice thicknesses, compared to the first diagnostic imaging scan or second diagnostic imaging scan. As is described in more detail below, it can be advantageous for the navigator slices to be thicker than the scan data slices of the first diagnostic imaging scan or the second diagnostic imaging scan.

According to the inventive procedure, the at least two navigator slices are both recorded chronologically between the first diagnostic imaging scan and the second diagnostic imaging scan. In this way, the at least two navigator slices can be acquired with a particularly short time interval between each other. This advantageously enables the same or similar state of motion of the examination object, for example the same or similar respiratory phase, to be present during the recording of the at least two navigator slices. In this way, the at least two navigator slices can be used to correct the first set of magnetic resonance scan data and the second set of magnetic resonance scan data. In this context, the chronologically coordinated recording of the at least two navigator slices can enable a particularly precise determination of correction parameters for the correction. Preferably, as described in more detail, the at least two navigator slices are excited and/or read out simultaneously.

Hence, the inventive navigator scan enables a particularly advantageous compensation of physiological influences of the object to be examined, for example a motion of the object to be examined. A correction in short time scales is possible. It is also possible for a robust slice-specific correction to be implemented by means of suitable positioning of the navigator slices. To compensate the physiological influences of the object to be examined, it is possible in specific cases for a navigator reference scan to be performed, at the start of the magnetic resonance imaging of the object to be examined. It is then possible for the at least two navigator slices to be related to the reference navigator slices recorded during the navigator reference scan for the compensation.

Preferably, as described in more detail below, the at least two navigator slices are used to perform a phase correction of the first set of magnetic resonance scan data and the second set of magnetic resonance scan data. In addition to the correction parameters derived from the at least two navigator slices, it is also possible to use correction parameters from the actual magnetic resonance scan data, for example from a center of k-space, for the phase correction.

Alternatively or additionally, it is also conceivable for a motion correction of the first set of magnetic resonance scan data and the second set of magnetic resonance scan data to be performed using the at least two navigator slices. One motion correction procedure known to the person skilled in the art is retrospective motion correction, which typically compensates the motion of the object to be examined in the magnetic resonance image data after the acquisition of the magnetic resonance image data. A further motion correction procedure known to those skilled in the art is prospective motion correction, which typically includes the detection and correction of a motion of the object to be examined during the acquisition of the magnetic resonance scan data.

A further application of the at least two navigator slices recorded is the assignment of the first set of magnetic resonance scan data and the second set of magnetic resonance scan data recorded to different motion states or respiratory states of the object to be examined. For example, the at least two navigator slices the first set of magnetic resonance scan data can be allocated to a first state of motion and the second set of magnetic resonance scan data to a second state of motion. The magnetic resonance scan data assigned to different motion states can be used for the motion-dependent reconstruction of magnetic resonance image data, which then have enhanced image quality. This described procedure is particularly beneficial when the same scan data slice of the examination region is recorded more than once in one diagnostic imaging scan. This can be the case with diffusion imaging with high b-values.

To enable the correction to be determined particularly simply from the at least two navigator slices recorded, it is possible to make a modeling assumption for the correction. The modeling assumption can include correction parameters. In this context, one example is a rigid modeling assumption for the correction, which includes six correction parameters, namely three translation parameters and three rotation parameters. The use of a rigid modeling assumption has in particular been found to be advisable in the case of the magnetic resonance imaging of a head of the object to be examined. It is also possible to make other modeling assumptions for the correction that are considered reasonable to those skilled in the art, for example non-rigid modeling assumptions. The use of a non-rigid and/or non-linear correction model is in particular advisable for image regions for which the modeling assumption of a rigid motion is not applicable. As described in more detail below, it is also possible to use a relationship between slice positions and correction information, in particular phase correction information, as a modeling assumption. For example, the modeling assumption can provide a linear or quadratic relationship.

The first set of magnetic resonance scan data recorded in the first diagnostic imaging scan and the second set of magnetic resonance scan data recorded in the second diagnostic imaging scan are in provided as an electronic output, i.e. displayed to a user on a display unit and/or stored in a database. The first set of magnetic resonance scan data and the second set of magnetic resonance scan data corrected using the at least two navigator slices recorded can be provided.

Further developments of the method are possible. For example, image scans and navigator scans can be performed in alternation. For example, in each case the at least two navigator slices can be acquired at a defined point during a repetition time of the magnetic resonance sequence. In this way, several items of correction information can be determined at different times during the course of the magnetic resonance sequence. In this way, a dynamic reaction to changing physiological parameters of the object to be examined can be made during the magnetic resonance imaging. In this context, it is possible for a navigator scan to be performed before or after each diagnostic imaging scan. Alternatively, the navigator scans can be inserted only sporadically between the image scans, for example after a specific number of image scans or only before inversion blocks.

In another embodiment, for recording the at least two navigator slices in the navigator scan, the at least two navigator slices are excited simultaneously by radiation of a multiband radio-frequency excitation pulse.

Such a multiband radio-frequency excitation pulse typically effects an excitation of the magnetization in a number of excitation bands in the examination region, for example by 90 degrees. In this context, the multiband radio-frequency excitation pulse typically ensures that magnetic resonance signals can be read out from the multiple excitation bands. The multiple excitation bands are spatially arranged corresponding to the at least two navigator slices. In this way, the multiband radio-frequency excitation pulse is able to excite the at least two navigator slices simultaneously. As a result, the multiband radio-frequency excitation pulse acts simultaneously on all the navigator slices or on a number of navigator slices that is a subset of the at least two navigator slices. The simultaneous excitation of at least two navigator slices ensures that the magnetization is excited in the at least two navigator slices at the same state of motion of the object to be examined, for example the same respiratory state. In this way, it is possible to determine correction parameters for the first set of magnetic resonance scan data and the second set of magnetic resonance scan data particularly precisely from the at least two navigator slices recorded.

Alternatively, it is possible for two single-band radio-frequency excitation pulses to be used for the excitation of the at least two navigator slices. However, then the at least two navigator slices are preferably excited immediately one after the other. This procedure is advantageous when the magnetic resonance device does not have the necessary components to radiate multiband radio-frequency excitation pulses.

In another embodiment, for recording the at least two navigator slices in the navigator scan, the magnetic resonance signals emitted from the at least two navigator slices are acquired simultaneously.

To this end, the magnetic resonance signals from the at least two navigator slices can be read out simultaneously superimposed in k-space. The subsequent reconstruction of the scan data from the at least two navigator slices then includes a separation of the simultaneously read-out magnetic resonance signals with respect to the at least two navigator slices. For the simultaneous acquisition of the magnetic resonance signals from the at least two navigator slices, the at least two navigator slices can also be simultaneously excited. The simultaneous reading-out of the magnetic resonance signals ensures that the magnetic resonance signals are read out during the same motion state of the object to be examined. In this way, it is possible for correction parameters for the first set of magnetic resonance scan data and the second set of magnetic resonance scan data to be determined particularly precisely from the at least two navigator slices recorded.

In another embodiment, recording the at least two navigator slices in the navigator scan is performed using a simultaneous multi-slice measuring technique and/or a simultaneous echo-refocusing technique.

The simultaneous multislice technique (SMS technique) is known, for example, from the following publication: Setsompop et al. "Blipped-controlled aliasing in parallel imaging for simultaneous multislice echo planar imaging with reduced g-factor penalty." Magn Reson Med. 2012. 67(5):1210-1224. The simultaneous echo refocusing technique (SER technique) is known, for example, from the following publication: Feinberg et al., "Simultaneous Echo Refocusing in EPI", Magnetic Resonance in Medicine, 48: 1-5 (2002). Both techniques are known to those skilled in the art and so they need not be described in further detail herein. Both techniques enable accelerated acquisition of the at least two navigator slices and a simultaneous recording of the at least two navigator slices. This can provide the described advantages with respect to the scanning of the navigator slices during the same motion states of the object to be examined. It is also possible for the simultaneous multislice technique and/or the simultaneous echo refocusing technique to be used for the first diagnostic imaging scan or the second diagnostic imaging scan.

In another embodiment, the navigator scan includes recording of at least four navigator slices, wherein at least two first navigator slices of the at least four navigator slices are situated on a first side of the opposite sides of the examination region and at least two second navigator slices of the at least four navigator slices are situated on a second side of the opposite sides of the examination region.

In this context, the at least four navigator slices are situated symmetrically with respect to the examination region. This means exactly the same number of navigator slices are positioned on a first side of the opposite sides of the object to be examined as on a second side of the opposite sides of the object to be examined. Recording of more than two navigator slices can provide valuable additional information that enables a more precise correction of the first set of magnetic resonance scan data and the second set of magnetic resonance scan data using the at least four navigator slices.

In an embodiment, the at least two navigator slices are situated completely outside the examination region.

In this embodiment, the at least two navigator slices and the examination region are thus completely spatially disjoint. This mean that there is no spatial point that is simultaneously contained in the at least two navigator slices and in the examination region. The arrangement of the at least two navigator slices completely outside the examination region ensures that the recording of the at least two navigator slices does not affect the examination region, in particular the stationary state of magnetization in the examination region. In this context, the at least two navigator slices and the examination region can adjoin one another. It is alternatively possible for a separation region to exist between the at least two navigator slices and the examination region, thus more powerfully preventing the recording of the at least two navigator slices from affecting the tissue localized in the examination region.

In another embodiment, each of the at least two navigator slices has a first slice thickness and each of the scan data slices of the first subregion and second subregion of the examination region has a second slice thickness, wherein the first slice thickness is greater than the second slice thickness.

It can be particularly advantageous to use a larger slice thickness for the navigator slices. It is then namely possible for correction parameters for the correction of the first set of magnetic resonance scan data and the second set of magnetic resonance scan data to be compiled particularly robustly from the recorded navigator slices. Thicker navigator slices result in an enhanced signal-to-noise ratio in the navigator slices recorded. For example, the compilation of the correction parameters can be made more stable by the adaptation of fit curves.

In another embodiment, the first diagnostic imaging scan is performed during a first repetition interval and the second diagnostic imaging is performed scan during a second repetition interval, which occurs chronologically immediately after the first repetition interval, and the navigator scan is performed during a dead time between the first repetition interval and the second repetition interval.

A repetition interval typically has a recurrent pattern of radio-frequency pulses and gradient pulses within one magnetic resonance sequence. In this context, the repetition interval can include the period that passes between two radio-frequency excitation pulses of the magnetic resonance sequence. A repetition interval typically lasts one repetition time. The dead time between the first repetition interval and the second repetition interval in particular represents a time interval during which no radio-frequency pulses and gradient pulses are to be activated according to the magnetic resonance sequence for the acquisition of the diagnostic magnetic resonance scan data. For example, the magnetization may be expected to return to a starting position during the dead time.

In this context, the navigator scan can be performed at least partially or completely during the first repetition interval, in particular at an end of the first repetition interval. This is the case when the dead time represents a part of the first repetition interval. It is advantageous to use navigators when the magnetic resonance sequence provides longer waiting times or dead times during the scanning during which navigator slices can then be recorded. In this way, it is possible to avoid an increase in the scanning time of the magnetic resonance imaging as a result of the performance of the navigator scan.

In another embodiment, the recording of the first set of magnetic resonance scan data in the first diagnostic imaging scan and the recording of the second set of magnetic resonance scan data in the second diagnostic imaging scan includes the use of a diffusion imaging technique.

The diffusion imaging technique typically includes the use of diffusion gradients with a specific diffusion weighting, which is usually described with a b-value. Diffusion imaging techniques are known to those skilled in the art and thus need not be described in further detail herein.

With this embodiment, the navigator scan is performed during a dead time between the first repetition interval and the second repetition interval. With diffusion imaging, typically a minimum repetition time is necessary to ensure sufficient contrast. If, for example the diffusion imaging technique is now used together with a simultaneous multislice scan technique, in specific cases, the repetition time actually required for the scanning can be less than the minimum repetition time. This can give rise to distinct dead times during which the navigator slices can then particularly advantageously be recorded. Due to the need for a gradient balance model, the minimum repetition time is also not completely used for a diffusion imaging technique using single-band pulses.

In another embodiment, a phase correction of the first set of magnetic resonance scan data and the second set of magnetic resonance scan data is performed using the at least two navigator slices recorded in the navigator scan.

For the phase correction, correction phase values calculated on the basis of the at least two recorded navigator slices are used. The phase correction can include, for example, a correction or compensation of a background phase in the first set of magnetic resonance scan data and the second set of magnetic resonance scan data. A compensation of the background phase of this kind can be beneficial with the use of a functional magnetic-resonance technique and/or with the use of an echo-planar imaging technique. The phase correction can also include a correction of phase influences of a motion of the object to be examined, for example a respiratory motion. For the phase correction, the inventive positioning of the at least two navigator slices on the opposite sides of the examination region can be particularly advantageous.

The recording of the at least two navigator slices for the phase correction can include the use of particularly low flip angles for the radio-frequency pulses of the navigator scan. The image contrast is usually of subordinate interest when the at least two navigator slices are to be used for the phase correction. This, for example, enables a large number of navigator slices to be recorded without exposing the object to be examined to a critical specific absorption rate load (SAR load).

In another embodiment, the phase correction includes the determination of a first phase value from a first navigator slice of the at least two navigator slices and a second phase value from a second navigator slice of the at least two navigator slices, wherein a correction phase value for the phase correction of the first set of magnetic resonance scan data and the second set of magnetic resonance scan data is determined the first phase value and the second phase value.

The determination of the first phase value from the first navigator slice and the determination of the second phase value from the second navigator slice can be performed by methods known to those skilled in the art. It is also possible for a number of first navigator slices to be included in the determination of the first phase value and a number of second navigator slices to be included in the determination of the second phase value. The first phase value and the second phase value can then be included in a determination algorithm that produces the correction phase value for the phase correction of the first set of magnetic resonance scan data and the second set of magnetic resonance scan data as output parameters. It is also possible for a different correction phase value to be determined for the phase correction of the first set of magnetic resonance data than for the phase correction of the second set of magnetic resonance data from the first phase value and the second phase value.

Since the first navigator slice and the second navigator slice are situated on opposite sides of the examination region, the correction phase value can be determined by an interpolation between the first phase value and the second phase value. The correction phase value can then be used to perform the phase correction of a scan data slice arranged spatially between the first navigator slice and the second navigator slice.

The magnetic resonance apparatus according to the invention has a scan data acquisition scanner that is operated to carry out the method according to the invention.

The magnetic resonance apparatus according to the invention is designed to carry out the inventive method for magnetic resonance imaging of an object to be examined. The scan data acquisition scanner is operated to perform a first diagnostic imaging scan that includes recording a first set of magnetic resonance scan data from a first subregion of an examination region, and to perform a second diagnostic imaging scan that includes of a second set of magnetic resonance scan data from a second subregion of the examination region. The scanner is also operated to perform a navigator scan chronologically between the first diagnostic imaging scan and the second diagnostic imaging scan, wherein the navigator scan includes recording at least two navigator slices, which are situated on opposite sides of the examination region.

The computer that operates the scanner as described above can have a correction processor configured to perform a phase correction of the first set of magnetic resonance scan data and the second set of magnetic resonance scan data using the at least two navigator slices recorded in the navigator scan.

The present invention also encompasses a non-transitory, computer-readable data storage medium encoded with programming instructions that, when the storage medium is loaded into a computer system of an imaging apparatus, cause the computer to operate the imaging apparatus to implement the method as described above.

In this context, the computer must have components such as an appropriate working memory, an appropriate graphics card or an appropriate logic unit so that the respective method steps can be carried out efficiently. Examples of electronically readable data media include a DVD, a magnetic tape, hard disk or a USB Stick on which electronically readable control information, in particular software (see above) is stored.

The advantages of the magnetic resonance apparatus and the storage medium according to the invention substantially correspond to the advantages of the method according to the invention, as described in detail above. Such features, advantages or alternative embodiments are applicable to the other aspects of the invention. The functional features of the method are implemented by corresponding objective modules, in particular by hardware modules.

BRIEF DESCRIPTION OF THE DRAWINGS

FIG. 5 is a schematic illustration of a phase correction according to a fourth embodiment of the method according to the invention.

DESCRIPTION OF THE PREFERRED EMBODIMENTS

Figure 1:
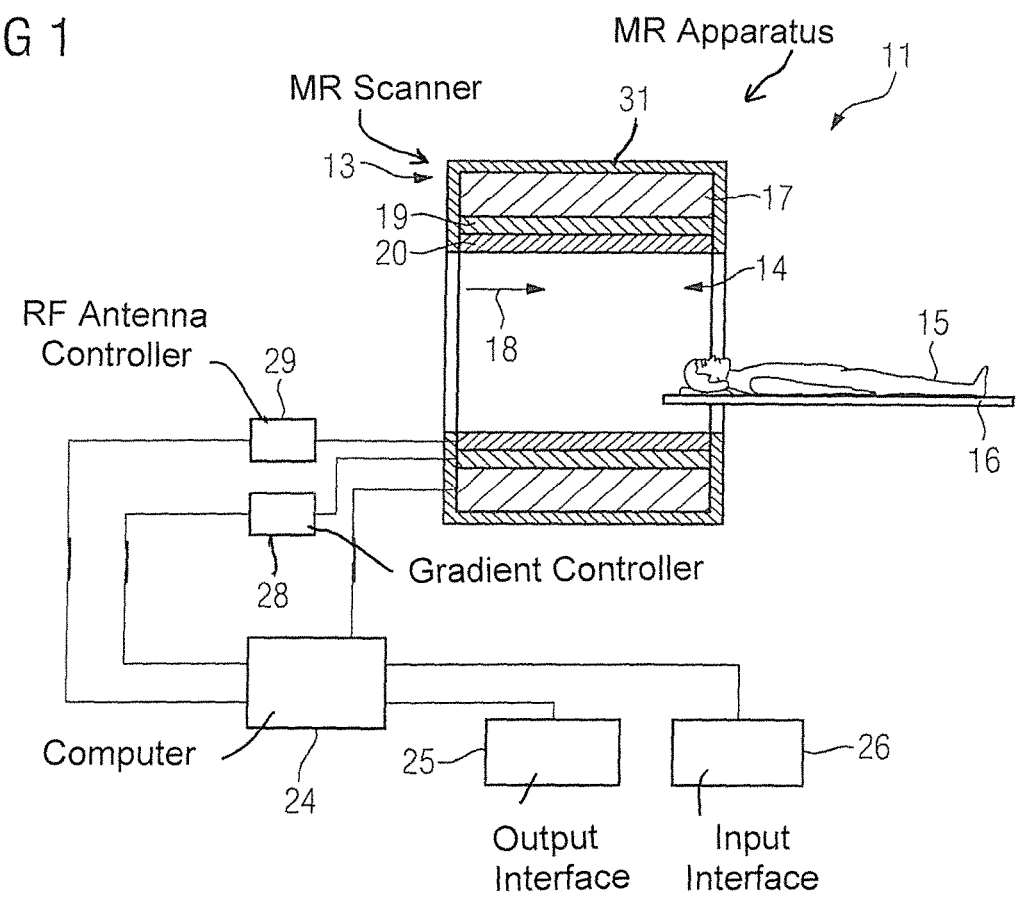
FIG. 1 is a block diagram of a magnetic resonance apparatus according to the invention.

FIG. 1 is a block diagram of a magnetic resonance apparatus 11 according to the invention. The magnetic resonance apparatus 11 has a data acquisition scanner 13 with a basic field magnet 17 that generates a strong and constant basic magnetic field 18. The scanner 13 has a cylindrical patient-receiving region 14 for making a recording of an object to be examined 15, in the present case a patient, wherein the patient-receiving region 14 is cylindrically enclosed circumferentially by the scanner 13. The patient 15 can be moved into the patient-receiving region 14 by a patient support 16. The patient support 16 has an examination table that is movable within the scanner 13. The scanner 13 is shielded from the outside of a housing shell 31.

The scanner 13 also has a gradient-coil arrangement 19 to generate magnetic field gradients used for a spatial encoding during imaging. The gradient-coil arrangement 19 is actuated by a gradient controller 28. The scanner 13 also has a radio-frequency antenna arrangement 20, which, in the shown embodiment, is a body coil permanently integrated in the scanner 13. The radio-frequency antenna arrangement 20 is actuated by a radio-frequency antenna controller 29 and emits radio-frequency magnetic resonance sequences into an examination chamber that is substantially formed by the patient-receiving region 14. The radio-frequency sequences excite nuclear spins of certain atoms of the patient 15 so as to cause the excited nuclear spins to deviate from the alignment or polarization produced by the basic magnetic field 18, by an amount known as a "flip angle." As the excited nuclear spins relax (return to the steady state), they emit radio-frequency signals, called magnetic resonance signals. The radio-frequency antenna arrangement 20 is further designed to receive the magnetic resonance signals from the patient 15.

The magnetic resonance apparatus 11 comprises a computer 24 to control the basic magnet 17, the gradient controller 28 and the radio-frequency antenna controller 29. The computer 24 centrally controls the magnetic resonance apparatus 11, for example for the performance of a predetermined imaging gradient-echo sequence. Control information such as, for example, imaging parameters, and reconstructed magnetic resonance images can be provided to a user via an output interface 25, in the present case a display, of the magnetic resonance apparatus 11. The magnetic resonance apparatus 11 also has an input interface 26 via which information and/or parameters can be entered by a user during a scanning process. The computer 24 can include the gradient controller 28 and/or the radio-frequency antenna controller 29 and/or the output interface 25 and/or the input interface 26.

Together with the scanner 13 and the computer 24, the magnetic resonance apparatus 11 is designed to carry out the method according to the invention for magnetic resonance imaging of the object is to be examined.

The magnetic resonance apparatus 11 shown can have further components that are conventionally present in magnetic resonance apparatuses. The general mode of operation of a magnetic resonance apparatus is known to those skilled in the art, so a detailed description of such operation and the further components is not necessary herein.

Figure 2:
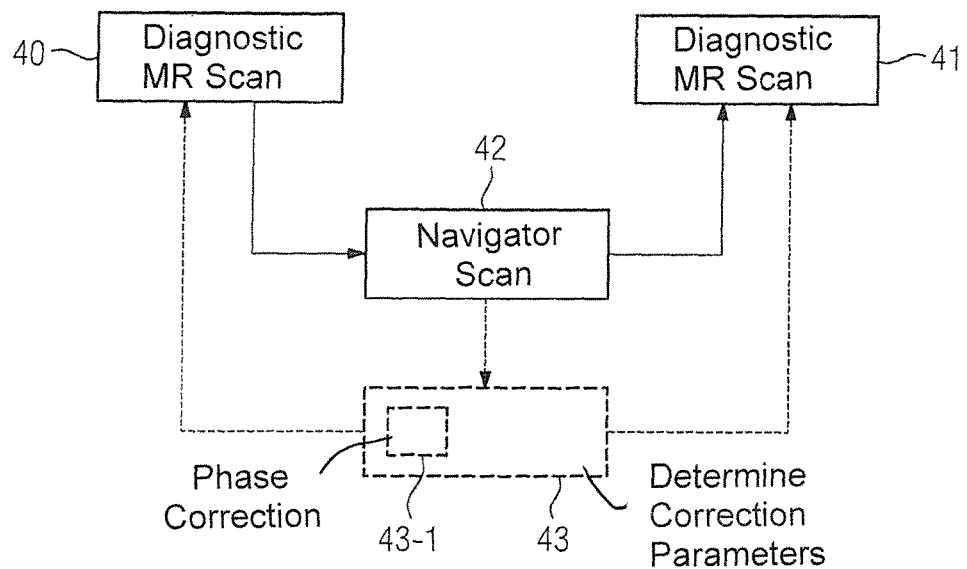
FIG. 2 is a sequence diagram of an embodiment of the method according to the invention.

FIG. 2 is a sequence diagram of an embodiment of the method according to the invention for magnetic resonance imaging of an object to be examined 15 by means of a magnetic resonance apparatus 11.

In a first method step 40, a first diagnostic imaging scan is performed by means of the scanner 13, wherein the first diagnostic imaging scan includes a recording of a first set of magnetic resonance scan data from a first subregion of an examination region.

In a further method step 42, a navigator scan is performed by means of the scanner 13 chronologically between the first diagnostic imaging scan and the subsequent second diagnostic imaging scan, wherein the navigator scan includes a recording of at least two navigator slices, which are situated on opposite sides of the examination region.

In a further method step 41, a second diagnostic imaging scan is performed by the scanner 13, wherein the second diagnostic imaging scan includes a recording of a second set of magnetic resonance scan data from a second subregion of the examination region.

In a further method step 43, at least two navigator slices can be used to determine correction parameters, by a parameter-determining processor of the computer 24 of the magnetic resonance apparatus 11. In this context, the specific correction parameters determined in the further method step 43 can be used for a correction of the first set of magnetic resonance scan data recorded in the first method step 40 and the second set of magnetic resonance scan data recorded in the further method step 41. The first set of magnetic resonance scan data and the second set of magnetic resonance scan data corrected in this way or magnetic resonance image data reconstructed from the first set of magnetic resonance scan data and the second set of magnetic resonance scan data corrected in this way can then be provided, i.e. displayed on the output interface 25 and/or stored in a database.

In this context, the determination of the correction parameters in the further method step 43 can include a determination of phase correction parameters in a sub-step 43-1 of the further method step 43. For example, a phase correction of the first set of magnetic resonance scan data and the second set of magnetic resonance scan data can be performed using the at least two navigator slices recorded in the navigator scan. In this context, the phase correction can include in sub-step 43-1, the determination of a first phase value from a first navigator slice of the at least two navigator slices and of a second phase value from a second navigator slice of the at least two navigator slices. Then, the first phase value and the second phase value can then be used in sub-step 43-1 to determine a correction phase value for the phase correction of the first set of magnetic resonance scan data and the second set of magnetic resonance scan data.

The method steps of the method according to the invention shown in FIG. 2 are carried out by the computer 24. To this end, the computer 24 has the necessary software and/or computer programs, which are stored in a memory unit of the computing unit. The software and/or computer programs include program code designed to carry out the method according to the invention when the program code is executed in the computer 24.

Figure 3:
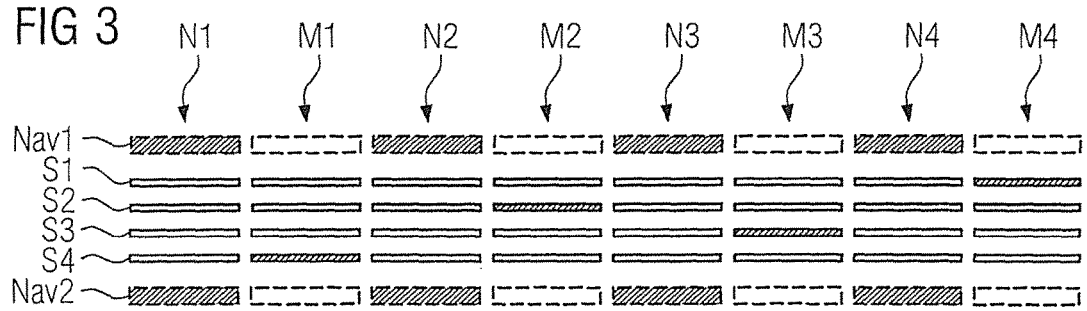
FIG. 3 is a schematic illustration of the image scans and navigator scan according to the second embodiment of a method according to the invention.

FIG. 3 is a schematic illustration of the image scans and navigator scan according to a second embodiment of a method according to the invention.

FIG. 3 shows an exemplary alternating sequence of navigator scans N1, N2, N3, N4 and image scans M1, M2, M3, M4. For each of the scans, in each case the at least one slice, which is excited and read out in the respective scan is shown. This at least one slice is then depicted for the respective scan as a filled-in rectangle, while the other slices are depicted as not filled-in.

The examination region shown in FIG. 3, from which the magnetic resonance scan data is acquired, includes by way of example four scan data slices S1, S2, S3, S4. Two navigator slices Nav1, Nav2 are arranged on opposite sides of the examination region. In this context, the first navigator slice Nav1 is arranged above the examination region, wherein the second navigator slice Nav2 is arranged below the examination region.

In the case shown in FIG. 3, the navigator slices Nav1, Nav2 are arranged completely outside the examination region. In this way, it can, for example be ensured that, during the recording of the navigator slices Nav1, Nav2, the magnetization in the scan data slices S1, S2, S3, S4 remains in a stationary state. Furthermore, in the case shown, the two navigator slices Nav1, Nav2 have a first slice thickness and the scan data slices S1, S2, S3, S4 of the examination region have a second slice thickness, wherein the first slice thickness is larger than the second slice thickness.

In each diagnostic imaging scan M1, M2, M3, M4, in each case magnetic resonance scan data is recorded from a different scan data slice S1, S2, S3, S4. For example, in the first diagnostic imaging scan M1, a first set of magnetic resonance scan data is recorded from the fourth scan data slice S4. In the example shown in FIG. 3, in each navigator scan N1, N2, N3, N4, in each case both navigator slices are excited and read out. For example, the two navigator slices Nav1, Nav2 are recorded chronologically after the first diagnostic imaging scan M1 in the second navigator scan N2. It is then possible for a second set of magnetic resonance scan data from the second scan data slice S2 to be recorded chronologically after the second navigator scan N2 in the second diagnostic imaging scan M1. Hence, during the recording of the scan data slices S1, S2, S3, S4, no navigator slice Nav1, Nav2 is recorded and vice versa.

In this context, the first diagnostic imaging scan M1 can be performed during a first repetition interval and the second diagnostic imaging scan M2 can be performed during a second repetition interval which is performed chronologically immediately after the first repetition interval. For example, the second navigator scan N2 can be performed during a dead time between the first repetition interval and the second repetition interval. In this context, in specific applications in which the dead times can be particularly advantageously distinct, the recording of the first set of magnetic resonance scan data in the first diagnostic imaging scan M1 and the recording of the second set of magnetic resonance scan data in the second diagnostic imaging scan M2 can make use of a diffusion imaging technique.

For the recording of the two navigator slices Nav1, Nav2 in the navigator scans N1, N2, N3, N4, the two navigator slices Nav1, Nav2 can be excited simultaneously by means of a multiband radio-frequency excitation pulse. It is also possible for the magnetic resonance signals emitted from the two navigator slices Nav1, Nav2 to be acquired simultaneously. In this context, the recording of the two navigator slices Nav1, Nav2 in the navigator scans N1, N2, N3, N4 can be performed using a simultaneous multi-slice measuring technique and/or a simultaneous echo-refocusing technique. Hence, in the case shown in FIG. 3, the navigator scans N1, N2, N3, N4 are performed using a multiband factor of two, while the scan data slices S1, S2, S3, S4 in the image scans M1, M2, M3, M4 are, as an example, only excited with single-band radio-frequency pulses.

Figure 4:
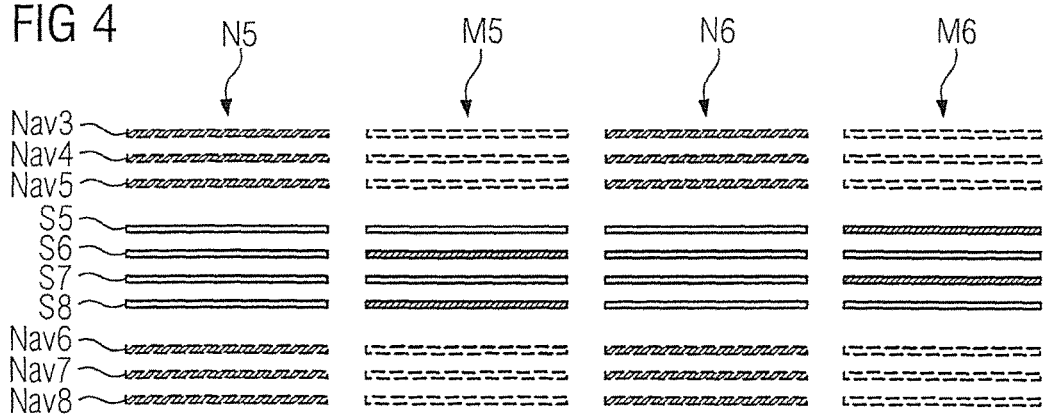
FIG. 4 is a schematic illustration of the image scans and navigator scan according to a third embodiment of the method according to the invention.

FIG. 4 is a schematic illustration of the image scans and navigator scan according to a third embodiment of a method according to the invention.

FIG. 4 shows the example, two navigator scans N5, N6, which alternate with two image scans M5, M6. As in FIG. 3, once again the slices that are excited or read out are depicted as filled-in and the slices that are not excited or read out slices are depicted as not filled-in.

Once again, the examination region should include four scan data slices S5, S6, S7, S8. However, unlike the example in FIG. 3, in each diagnostic imaging scan M5, M6 in each case two scan data slices S5, S6, S7, S8 are excited and read out with a multiband factor of two.

Each navigator scan N5, N6 has an example, a recording of six navigator slices Nav3, Nav4, Nav5, Nav6, Nav7, Nav8, wherein three first navigator slices Nav3, Nav4, Nav5 are arranged on a first side of the opposite sides of the examination region and three second navigator slices Nav6, Nav7, Nav8 are arranged on a second side of the opposite sides of the examination region. According to FIG. 4, the six navigator slices Nav3, Nav4, Nav5, Nav6, Nav7, Nav8 are excited simultaneously in each navigator scan N5, N6 by means of a multiband radio-frequency excitation pulse with a multiband factor of six and the magnetic resonance signals emitted from the six navigator slices Nav3, Nav4, Nav5, Nav6, Nav7, Nav8 are acquired simultaneously.

The temporal and spatial scanning schemes shown in FIG. 3 and FIG. 4 should obviously only be considered to be for purposes of illustration and by way of example. Obviously, the examination region can also include a different number of scan data slices. It is also possible for a different number of navigator slices to be acquired in the navigator scan. The spatial arrangement and the slice thicknesses of the navigator slices or scan data slices can obviously also be embodied differently than in FIG. 3 and FIG. 4. In addition, the number and sequence of the image scans and navigator scans are only selected arbitrarily in FIG. 3 and FIG. 4. It is also possible for a plurality of image scans to be performed in succession before a navigator scan is performed between two image scans. The image scans and navigator scans can also overlap chronologically at least partially or completely.

FIG. 5 is a schematic illustration of a phase correction according to a fourth embodiment of the method according to the invention.

FIG. 5 depicts a possibility for illustrating a slice-specific extraction of phase correction parameters for individual scan data slices 56, 57, 58 from two navigator slices 54, 55. In this context, for the example in FIG. 5, the scan data slices 56, 57, 58 and the navigator slices 54, 55 should be positioned in a head of the object to be examined 15. In this context, the arrangement of slices is shown in the image window at the upper right image edge in FIG. 5.

For the example in FIG. 5, the scan data slices 56, 57, 58 are acquired by means of an acquisition scheme at three different time points 59, 60, 61. The navigator slices 54, 55 are excited and read out simultaneously by a multiband-radio-frequency pulse with a multiband factor of 2.

It is now possible to determine a time-dependent first phase value from the first navigator slice 54, while a time-dependent second phase value can be determined from the second navigator slice 55. A first time characteristic 52 of the first measured phase value and a second time characteristic 53 of the second measured phase value are plotted in the window 50. In this context, the first phase value and the second phase value can be recorded with a high temporal resolution. The time range in which the three different time points 59, 60, 61 are contained is indicated in the window 50 by means of a dashed box 62.

It is now possible to determine a slice-specific correction phase value 59$d$, 60$d$, 61$d$ for each of the three different time points 59, 60, 61 for the scan data slice 56, 57, 58 scanned at this time 59, 60, 61. To this end, the respective slice-specific correction phase value 59$d$, 60$d$, 61$d$ from the first phase value 59e, 60e, 61e and second phase value 59c, 60c, 61c scanned for the respective time points 59, 60, 61 is interpolated for each time point 59, 60, 61.

The respective interpolations for the determination of the correction phase values 59d, 60d, 61d are depicted schematically in the windows belonging to the time points 59, 60, 61 at the lower edge of FIG. 5. The windows belonging to the time points 59, 60, 61 in each case have a slice position axis 59a, 60a, 61a and a phase value axis 59b, 60b, 61b.

The respective first measured phase value 59c, 60c, 61c for each time point 59, 60, 61 is plotted for the first slice position of the first navigator slice 54. Furthermore, the respective second measured phase value 59e, 60e, 61e for each time point 59, 60, 61 is plotted for the second slice position of the second navigator slice 55. Linear interpolation is now possible for each time point 59, 60, 61 between the respective plotted first phase value 59c, 60c, 61c and second phase value 59e, 60e, 61e. The point of intersection between the respective interpolation and the slice position of the scan data slice 56, 57, 58 recorded at the time point 59, 60, 61 can then be used as a slice-specific correction phase value 59d, 60d, 61d for the respective scan data slice 56, 57, 58.

In this way, it is possible for the slice-specific correction phase values 59d, 60d, 61d for the phase correction of the magnetic resonance scan data recorded from the scan data slices 56, 57, 58 to be determined from the two navigator slices 54, 55.

In this context, FIG. 5 demonstrates the possibility of using linear interpolation for the determination of the correction phase values 59d, 60d, 61d. Obviously, other possibilities for interpolation between the measured first phase value 59e, 60e, 61e and second phase value 59c, 60c, 61c are also conceivable.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance data from a subject comprising:
from a computer, operating a magnetic resonance data acquisition scanner to execute a first diagnostic imaging scan, comprising acquiring a first set of magnetic resonance scan data from a first sub-region of an examination region of a subject situated in the scanner;
from said computer, operating the magnetic resonance data acquisition scanner to execute a second diagnostic imaging scan, comprising acquiring a second set of magnetic resonance scan data from a sub-region of the examination region of the subject situated in the scanner;
from said computer, operating the magnetic resonance data acquisition scanner to execute a navigator scan chronologically between said first diagnostic imaging scan and said second diagnostic imaging scan, said navigator scan comprising acquiring navigator data from at least two navigator slices situated on opposite sides of said examination region of the subject situated in the scanner; and
from said computer, making the first and second sets of magnetic resonance scan data, and the navigator data, available from said computer in electronic form, as at least one data file.

2. A method as claimed in claim 1 comprising operating said magnetic resonance data acquisition scanner to acquire said navigator data from said at least two navigator slices in said navigator scan by radiating a multiband radio-frequency excitation pulse that simultaneously excites nuclear spins in all of said at least two navigator slices.

3. A method as claimed in claim 1 comprising operating said magnetic resonance data acquisition scanner in said navigator scan to simultaneously acquire said navigator scan as magnetic resonance signals emitted from said at least two navigator slices.

4. A method as claimed in claim 1 comprising operating said magnetic resonance data acquisition scanner in said navigator scan to acquire said navigator data from said at least two navigator slices using a technique selected from the group consisting of simultaneously multi-slice measuring and simultaneous echo-refocusing.

5. A method as claimed in claim 1 comprising operating said magnetic resonance data acquisition scanner in said navigator scan to acquire said navigator data from at least four navigator slices, with at least two first navigator slices among said at least four navigator slices being situated on a first side of opposite sides of said examination region, and with at least two second navigator slices among said at least four navigator slices situated on a second side of said opposite sides of said examination region.

6. A method as claimed in claim 1 comprising operating said magnetic resonance data acquisition scanner in said navigator scan to acquire said navigator data from said at least two navigator slices that are situated completely outside of said examination region.

7. A method as claimed in claim 1 comprising operating said magnetic resonance data acquisition scanner to acquire said first and second sets of magnetic resonance scan data respectively from scan data slices of said first sub-region and said second sub-region of said examination region, each having a slice thickness, and operating said magnetic resonance data acquisition scanner to acquire said navigator data in said navigator scan from said at least two navigator slices each having a navigator slice thickness that is larger than the thickness of said scan data slices.

8. A method as claimed in claim 1 comprising operating said magnetic resonance data acquisition scanner to execute said first diagnostic imaging scan during a first repetition interval and to execute said second diagnostic imaging scan during a second repetition interval that chronologically immediately follows said first repetition interval, and to execute said navigator scan during a dead time between said first repetition interval and said second repetition interval.

9. A method as claimed in claim 1 comprising operating said magnetic resonance data acquisition scanner to acquire said first and second sets of magnetic resonance scan data using a diffusion imaging technique.

10. A method as claimed in claim 1 comprising, in an image reconstruction computer, implementing a phase correction of said first and second sets of magnetic resonance scan data using said navigator data acquired in said navigator scan from said at least two navigator slices.

11. A method as claimed in claim 10 comprising, in said image reconstruction computer, implementing said phase correction by determining a first phase value from a first navigator slice among said at least two navigator slices, and determining a second phase value from a second navigator slice among said at least two navigator slices, and determining a correction phase value for phase correction of said first set of magnetic resonance scan data and said second set of magnetic resonance scan data from said first phase value and said second phase value.

12. A magnetic resonance apparatus comprising:
a magnetic resonance data acquisition scanner;
computer configured to operate said magnetic resonance data acquisition scanner to execute a first diagnostic imaging scan, comprising acquiring a first set of magnetic resonance scan data from a first sub-region of an examination region of a subject situated in the scanner;
said computer being configured to operate the magnetic resonance data acquisition scanner to execute a second diagnostic imaging scan, comprising acquiring a second set of magnetic resonance scan data from a sub-region of the examination region of the subject situated in the scanner;
said computer being configured to operate the magnetic resonance data acquisition scanner to execute a navigator scan chronologically between said first diagnostic imaging scan and said second diagnostic imaging scan, said navigator scan comprising acquiring navigator data from at least two navigator slices situated on opposite sides of said examination region of the subject situated in the scanner; and
said computer being configured to make the first and second sets of magnetic resonance scan data, and the navigator data, available from said computer in electronic form, as at least one data file.

13. A non-transitory, computer-readable data storage medium encoded with programming instructions, said data storage medium being loaded into a computer system of a magnetic resonance apparatus that comprises a magnetic resonance data acquisition scanner, said programming instructions causing said computer system to:
operate said magnetic resonance data acquisition scanner to execute a first diagnostic imaging scan, comprising acquiring a first set of magnetic resonance scan data from a first sub-region of an examination region of a subject situated in the scanner;
operate said magnetic resonance data acquisition scanner to execute a second diagnostic imaging scan, comprising acquiring a second set of magnetic resonance scan data from a sub-region of the examination region of the subject situated in the scanner;
operate said magnetic resonance data acquisition scanner to execute a navigator scan chronologically between said first diagnostic imaging scan and said second diagnostic imaging scan, said navigator scan comprising acquiring navigator data from at least two navigator slices situated on opposite sides of said examination region of the subject situated in the scanner; and
make the first and second sets of magnetic resonance scan data, and the navigator data, available from said computer system in electronic form, as at least one data file.

* * * * *